United States Patent
Kim et al.

(10) Patent No.: US 9,934,852 B2
(45) Date of Patent: Apr. 3, 2018

(54) SENSING AN OUTPUT SIGNAL IN A CROSSBAR ARRAY BASED ON A TIME DELAY BETWEEN ARRIVAL OF A TARGET OUTPUT AND A SNEAK OUTPUT

(71) Applicant: Hewlett Packard Enterprise Development LP, Houston, TX (US)

(72) Inventors: Kyung Min Kim, Palo Alto, CA (US); Ning Ge, Palo Alto, CA (US); Jianhua Yang, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/329,207

(22) PCT Filed: Jan. 23, 2015

(86) PCT No.: PCT/US2015/012746
§ 371 (c)(1),
(2) Date: Jan. 25, 2017

(87) PCT Pub. No.: WO2016/118165
PCT Pub. Date: Jul. 28, 2016

(65) Prior Publication Data
US 2017/0206957 A1    Jul. 20, 2017

(51) Int. Cl.
*G11C 11/00* (2006.01)
*G11C 13/00* (2006.01)

(52) U.S. Cl.
CPC ........ *G11C 13/004* (2013.01); *G11C 13/0007* (2013.01); *G11C 13/0061* (2013.01); *G11C 13/0004* (2013.01)

(58) Field of Classification Search
CPC .............. G11C 13/004; G11C 13/0007; G11C 13/0061; G11C 13/0004
USPC .................................. 365/148, 158, 205, 207
See application file for complete search history.

(56) References Cited

U.S. PATENT DOCUMENTS

| | | | |
|---|---|---|---|
| 6,259,644 B1 | 7/2001 | Tran et al. | |
| 6,456,524 B1 * | 9/2002 | Perner ..................... | G11C 11/16 365/148 |
| 7,405,960 B2 | 7/2008 | Cho et al. | |
| 7,889,538 B2 | 2/2011 | Toda | |

(Continued)

FOREIGN PATENT DOCUMENTS

WO    WO-2014018003    1/2014

OTHER PUBLICATIONS

International Searching Authority, The International Search Report and the Written Opinion, PCT/US2015/012746, dated Oct. 5, 2015, 12 Pages.

(Continued)

*Primary Examiner* — David Lam
(74) *Attorney, Agent, or Firm* — Fabian VanCott

(57) ABSTRACT

A method of sensing an output signal in a crossbar array is described. In the method, a selecting voltage is applied to a target memory element of the crossbar array. Also in the method, a non-selecting voltage is applied to non-target memory elements of the crossbar array. Further in the method, a target output that is associated with the target memory element is isolated, with sensing circuitry, from a sneak output based on a time delay between arrival of the target output and the sneak output and the target output is sensed.

20 Claims, 6 Drawing Sheets

(56) References Cited

U.S. PATENT DOCUMENTS

| | | |
|---|---|---|
| 8,605,485 B2 | 12/2013 | Kanno et al. |
| 8,737,112 B2 * | 5/2014 | Park .................. G11C 13/0069 365/148 |
| 2002/0141222 A1 | 10/2002 | Nair et al. |
| 2004/0042288 A1 | 3/2004 | Chow |
| 2014/0104923 A1 | 4/2014 | Baek et al. |
| 2014/0185358 A1 | 7/2014 | Jo et al. |
| 2014/0254242 A1 | 9/2014 | Siau |
| 2014/0313816 A1 | 10/2014 | Ribeiro et al. |

OTHER PUBLICATIONS

Zidan, M.A., et al., Memristor-based Memory: the Sneak Paths Problem and Solutions, Oct. 29, 2012, Microelectronics Journal, 9 pages.

* cited by examiner

SENSING AN OUTPUT SIGNAL IN A CROSSBAR ARRAY BASED ON A TIME DELAY BETWEEN ARRIVAL OF A TARGET OUTPUT AND A SNEAK OUTPUT

BACKGROUND

Memory arrays are used to store data. A memory array may be made up of a number of memory elements. Data may be stored to memory elements by assigning logic values to the memory elements within the memory arrays. For example, the memory elements may be set to 0, 1, or combinations thereof to store data in a memory element of a memory array. Much time and effort has been expended in designing and implementing nanoscale memory arrays. In some examples the nanoscale memory arrays may be arranged in a crossbar array where a first number of conducting lines intersect a second number of conducting lines to form a grid where memory elements are placed at each intersection.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
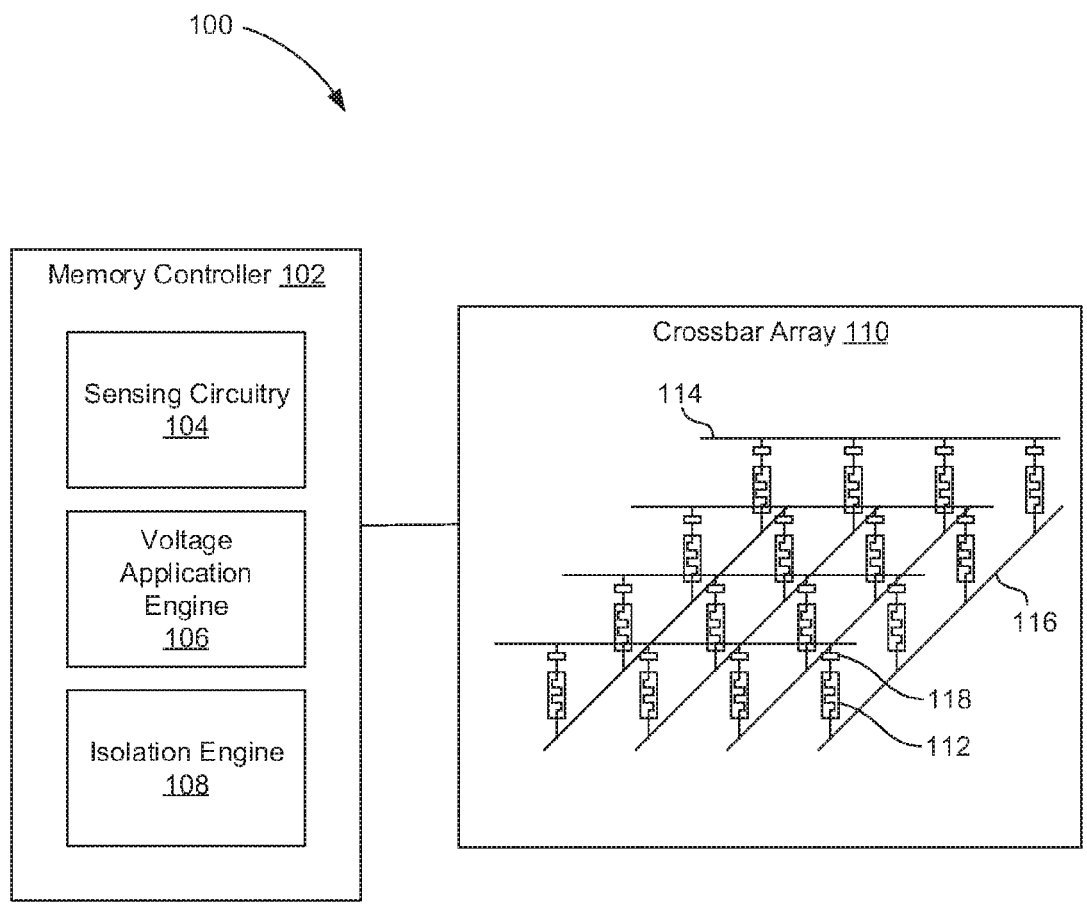
FIG. 1 is a diagram of a system for sensing an output signal in a crossbar array, according to one example of the principles described herein.

Increasingly smaller computing devices have led to an increased focus on developing smaller components, such as memory arrays. Crossbar arrays are one example of reduced-size memory arrays. Crossbar arrays of memory elements such as memristors may be used in a variety of applications, including non-volatile solid state memory, programmable logic, signal processing, control systems, pattern recognition, and other applications. A crossbar array includes a first set of conducting lines that intersect a second set of conducting lines, in an approximately orthogonal orientation for example. A memory element is placed at each intersection. In this example, a number of memory elements may share a particular first line and another number of memory elements may share a particular second line.

Each memory element can represent at least two logic values, for example a 1 and a 0. Memory elements such as memristors may use resistance levels to indicate a particular logic value. In using a memristor as an element in a memory array, a digital operation is emulated by applying activation energy, such as voltage pulses of different values or polarities to place the memristor in a "low resistance state" which resistance state is associated with a logical value, such as "1." Similarly, a voltage pulse of a different polarity, or different value, may place the memristor in a "high resistance state," which resistance state is associated with another logical value, such as "0." Each memristor has a switching voltage which refers to a voltage drop across a memristor which effectuates a change in the resistance state of the memristor. For example, a switching voltage of a memristor may be between 1-2 volts (V). In this example, voltage drop across the memristor that is greater than the switching voltage (i.e., the 1-2 V) causes the memristor to change between resistance states. While specific mention is made to voltage pulses, current may also be passed to switch a memristor resistance state.

To determine what resistance state, and corresponding logic value, is indicated by a memristor, an output current may be collected and analyzed. For example, if a write voltage is applied to a target memory element, a write current passing through the target memory element may be collected. Based on the write voltage and the collected write current, a resistance level of the memristor and corresponding written logic value may be ascertained. Similarly, if a read voltage is applied to a target memory element, a current passing through the target memory element may be collected. Based on the read voltage and the collected read current, a resistance level of the memristor and the corresponding stored logic value may be ascertained.

In these examples, a first portion of a selecting voltage (i.e., read voltage or write voltage) is applied to a target first line and a second portion of the selecting voltage (i.e., read voltage or write voltage) is applied to a target second line that correspond to the target memory element such that an overall voltage drop across the target memory element is large enough that the target memory element can be read from or written to. The second portion of the selecting voltage may be the same polarity or different polarity from the first portion as long as the overall voltage drop across the memory element is at least as great as the selecting voltage. An output current is then read that, along with the selecting voltage, can be used to determine the resistance of the target memory element and the corresponding logic value. However, while crossbar memory arrays may offer high density storage, certain characteristics may affect their usefulness in storing information.

For example, in applying a portion of a selecting voltage to a target first line and another portion of the selecting voltage to a target second line, other memory elements that fall along these target lines may also see a voltage drop, albeit a voltage drop smaller than the voltage drop across the target memory element. The voltage drop across these partially-selected memory elements generates a current path in the crossbar array. These additional current paths are referred to as sneak currents and are undesirable as they are noise to the intended target output current. Large sneak currents may lead to a number of issues such as saturating the current of driving transistors and increasing power consumption. Moreover, large sneak currents may introduce large amounts of noise which may lead to inaccurate or ineffective memory reading and writing operations.

In some examples, non-linear selectors may be incorporated to reduce the sneak currents in an array. A selector is a device that may be placed serially with a memory element to either allow, or suspend a memory element from seeing an applied voltage. A non-linear selector is a selector wherein the voltage/current relationship is non-linear. In other words, a small voltage, smaller than the selector threshold voltage, may result in a high impedance; while a voltage larger than the selector threshold voltage may result in a much lower impedance. In other words, a resistance value of the selector is very high for a low voltage, while for a high voltage, the resistance value becomes much smaller. For example, a voltage that is less than the selector threshold voltage, for example half of that voltage, applied to a non-linear selector will output very little current which decreases the overall sneak current. In other words, a non-linear selector inhibits the current flow through unselected and partially selected memory elements. However, the use of such non-linear selectors also has characteristics that limit their application in a crossbar array. For example, manufacturing and implementing non-linear selectors that have a high non-linearity and a high current density is difficult and time intensive and may increase the cost and power consumption of corresponding memory arrays.

The system and method described herein may alleviate these and other complications. More specifically, the present systems and methods describe isolation of a target output, i.e., a target current from a sneak output, i.e., a sneak current. This may include filtering a received output, which includes both the target current and the sneak current based on a time delay between the target current and the sneak current. It also may include selection of an output signal, such as an output current during a sensing period that isolates a target output current from a sneak current. Outside of this sensing period, the sensing circuitry is disabled. In other words, a time delay in the transmission of a target current and a sneak current is generated so that the desired target current can be read independently from the background sneak current. The time delay can be generated by inserting a voltage dependent time delay selector in series with a memristor and by passing a selecting voltage across a target memory element that is larger than a non-selecting voltage that is passed across a number of non-target memory elements.

The present disclosure describes a method for sensing an output signal in a crossbar array. The method includes applying a selecting voltage to a target memory element of the crossbar array; applying a non-selecting voltage to non-target memory elements of the crossbar array; isolating, with sensing circuitry, a target output that is associated with the target memory element from a sneak output based on a time delay between an arrival of the target output and the sneak output; and sensing the isolated target output.

The present disclosure describes a system for selecting an output signal in a crossbar array. The system includes a crossbar array of memory elements. The crossbar array includes a number of first lines and a number of second lines intersecting the first lines. A memory element is located at each intersection of a first line and a second line. The crossbar array also includes a number of selectors to select a corresponding memory element based on a selecting voltage, each selector corresponding to a memory element. The system also includes a memory controller. The memory controller includes sensing circuitry to sense a target output associated with a target memory element, a voltage application engine to apply a number of voltages to the memory elements, and an isolation engine to isolate the target output that is associated with the target memory element from a sneak output based on a time delay between arrival of the target output and the sneak output.

The present disclosure describes a non-transitory machine-readable storage medium encoded with instructions executable by a memory controller. The machine-readable storage medium includes instructions to apply a first portion and a second portion of a selecting voltage to a target first line and target second line, respectively, in which the target first line and target second line correspond to a target memory element; apply a first portion and a second portion of a non-selecting voltage to a number of non-target first lines and a number of non-target second lines, respectively that correspond to non-target memory elements; isolate a target output current from a non-target output current based on a time delay between an arrival of a target output current from a non-target output current. The selecting voltage is at least two times as large as the non-selecting voltage.

The systems and methods described herein may be beneficial by reducing the impact of sneak currents in the crossbar array on a target output current. For example, with large sneak path currents, operating a crossbar array is inefficient, if possible. Isolating the target output, either via a filter or by selecting a sensing period and recording an output during that sensing period, may also increase the reliability of read and write operations, reduce power consumption, and alleviate other undesirable effects of sneak current in a memory array.

As used in the present specification and in the appended claims, the term "memristor" may refer to a passive two-terminal circuit element that changes its electrical resistance under sufficient electrical bias. A memristor may receive a selecting voltage which may be a read voltage or a write voltage.

Further, as used in the present specification and in the appended claims, the term "target" may refer to a memory element that is to be written to or read from. Accordingly, a target first line and a target second line may be first lines and second lines that correspond to the target memory element and a target output may be a current output associated with the target memory element. A target memory element may refer to a memory element with a closed selector as opposed to an open selector.

Still further, as used in the present specification and in the appended claims, the term "partially-selected memory element" may refer to a memory element that falls along a target first line or a target second line. The partially-selected memory elements may have a voltage drop that is less than a voltage drop of the target memory element. A partially-selected memristor may receive either the first portion of the selecting voltage passed through a target first line or the second portion of the selecting voltage passed through a target second line.

Still further, as used in the present specification and in the appended claims the term "selecting voltage" may refer to a voltage that is applied to a memory element. The selecting voltage may be a write voltage that is larger than a switching voltage of a memory element, or may be a read voltage that is less than the switching voltage of the memory element. By comparison, a non-selecting voltage may refer to a voltage that is not greater than either a read voltage or a write voltage. The selecting voltage may be greater than a threshold voltage for a selector, the threshold voltage being a voltage sufficient to open a selector and a non-selecting voltage may be less than the threshold voltage for a selector.

Still further, as used in the present specification and in the appended claims, the terms "first lines" and "second lines" may refer to distinct conducting lines, such as wires, that are formed in a grid and apply voltages to the memory elements in the array. A memory element may be found at the intersection of a first line and a second line. In some examples, the first lines and second lines may be referred to as row lines and column lines.

Even further, as used in the present specification and in the appended claims, the term "non-linearity" may refer to a ratio of current at a first voltage level to the current at a second voltage level, in which the second voltage level is half the magnitude of the first voltage level in either the same or different polarity.

Yet further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described is included in at least that one example, but not necessarily in other examples.

Turning now to the figures, FIG. 1 is a diagram of a system (100) for sensing an output signal in a crossbar array (110), according to one example of the principles described herein. The system (100) may be implemented in an electronic device. Examples of electronic devices include servers, desktop computers, laptop computers, personal digital assistants (PDAs), mobile devices, smartphones, gaming systems, and tablets, among other electronic devices. The system (100) may be utilized in any data processing scenario including, stand-alone hardware, mobile applications, through a computing network, or combinations thereof. Further, the system (100) may be used in a computing network, a public cloud network, a private cloud network, a hybrid cloud network, other forms of networks, or combinations thereof.

The system (100) may include a crossbar array (110). The crossbar array (110) may include a number of first lines (114), a number of second lines (116), a number of memory elements (112), and a number of selectors (118) such as non-linear selectors that are connected serially with the memory elements (112). The combination of a memory element (112) and a selector (118) may be referred to as a memory cell. For simplicity, a single instance of each element is identified with a reference number. Even though four first lines (114) and four second lines (116) are depicted in FIG. 1, any number of first lines (114) and second lines (116) may be present in the crossbar array (110). As depicted in FIG. 1, the first lines (114) and the second lines (116) may be orthogonal to one another. The two layers of lines (114, 116) form a crossbar, each of the first lines (114) overlaying the second lines (116) and coming into close contact with each second line (116) at intersections that represent the closest contact between each line.

The lines (114, 116) may effectuate voltage potentials across the memory elements (112) by carrying current through the crossbar array (110). For example, a target first line (114) may supply a first portion of a voltage to the target memory element (112) while a target second line (116) applies a second portion of a voltage to the target memory element (112). The difference between the first portion and the second portion generates a voltage potential across the target memory element (112). The applied voltage may be either a voltage less than the switching voltage of the target memory element (112), i.e., a read voltage; or may be greater than the switching voltage of the target memory element (112), i.e., a write voltage. In some examples, the voltage supplied by the target first line (114) may be the total voltage value and the target second line (116) may be grounded. The remaining non-target first lines (114) and non-target second lines (116) may receive a fractional voltage drop that is less than a threshold voltage of the selectors (118) as will be described below.

At the intersection of each of the number of first lines (114) and each of the number of second lines (116) is a memory element (112), such as a memristor; a memristor being a non-volatile memory element. A memristor can be used to represent a number of bits of data. For example, a memristor in a low resistance state may represent a logic value of "1." The same memristor in a high resistance state may represent a logic value of "0." Each logic value is associated with a resistance state of the memristor such that data can be stored in a memristor by changing the resistance state of the memristor. This may be done by applying an access voltage to a target memristor by passing voltages to target lines that correspond to the target memristor.

A memristor is a specific type of memory element that can change resistances by transporting dopants within a switching layer to increase or decrease the resistivity of the memristor. As a sufficient voltage is passed across the memristor the dopants become active such that they move within a switching layer of the memristor and thereby change the resistance of the memristor.

A memristor is non-volatile because the memristor maintains its resistivity, and indicated logic value, even in the absence of a supplied voltage. In this manner, the memristors are "memory resistors" in that they "remember" the last resistance that they had. Memristance is a property of the electronic component referred to as a memristor. If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor is a resistor device whose resistance can be changed.

Memristors can be made in a number of geometries and using a variety of materials. One form is a metal-insulator-metal memristor. The term metal is meant to refer broadly to indicate a conductor, for instance doped silicon. A memristor may include a bottom electrode (metal), a switching layer (insulator), and a top electrode (metal). The bottom electrode is coated with an insulator to form a switching layer. This switching layer is then coated with a layer of another conductive material to form a top electrode. The switching layer may be an insulator between the bottom electrode and the top electrode. For example, in a first state, the switching layer may be insulating such that current does not readily pass between the bottom electrode to the top electrode. Then, during a switching event, the switching layer may switch to a second state, becoming conductive. In a conductive state, the switching layer allows a memristor to store information by changing the memristor state.

In some examples, the top electrode and bottom electrode of the memristor may be formed from a metallic material such as tantalum or a tantalum-aluminum alloy, or other conducting material such as titanium, titanium nitride, copper, aluminum, platinum, and gold among other metallic materials. The switching layer may be made of a metallic oxide. Specific examples of switching layer materials include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented, the switching layer may be ternary and complex oxides such as silicon oxynitride.

A memristor may be classified as an anion device. In an anionic device, the switching mechanism is the formation of oxygen vacancies in the switching layer that are positively charged and therefore lead to the formation of conducting channels in the switching oxide. By comparison, in a cation memristor the conducting channel is formed from an electrochemically active metal such as copper or silver. In some examples, a memristor may be both an anionic device and a cationic device. For example, an aluminum-copper-silicon alloy oxide based memristor could be an anionic device when the copper concentration is low or a cationic device when the copper concentration is high.

Each memory element (112) may be coupled to a selector (118). A selector (118) is a component that either allows current to flow through the memory element (112) or prevents current from flowing through the memory element (112). For example, the selector (118) may have a threshold voltage, $V_{th}$. When a voltage applied along a first line (114) is less than the threshold voltage, the selector (118) is open such that no current flows to a corresponding memory element (112). By comparison, when a voltage applied along a row line (114) is at least as great as the threshold voltage, the selector (118) closes such that current readily flows to a corresponding memory element (112). In this fashion, the selector (118) reduces the sneak current flowing through a crossbar array (110) by preventing current flow through unselected memory elements (112). Notwithstanding the selector (118), a sub-threshold voltage current may flow through each memory element (112).

The system (100) may also include a memory controller (102) to select an output signal of a crossbar array (110). The memory controller (102) may be an electrical device or component that, in addition to other functions, operates or controls a memory device. The memory controller (102) may include at least one of circuitry, a processor, or other electrical component.

The memory controller (102) further includes a number of engines used in the implementation of the systems and methods described herein. The engines refer to a combination of hardware such as circuitry and program instructions to perform a designated function. Each of the engines may include a processor and memory.

The memory controller (102) may include sensing circuitry (104). The sensing circuitry (104) may sense a target output associated with a target memory element (112). For example, the sensing circuitry (104) may collect a current along a target second line (116). For example, as a selecting voltage is applied to a target memory element (112), a current may be generated. This current may be collected along the second line (116) that corresponds to the target memory element (112) and from the target current a resistance state, and corresponding logic value, of the target memory element (112) may be ascertained.

The memory controller (102) may include a voltage application engine (106) to apply a number of voltages to the memory elements (112). For example, the voltage application engine (106) may include instructions and/or circuitry that direct voltage sources to apply selecting voltages and non-selecting voltages to the target memory elements (112) and non-target memory elements (112), respectively. Specifically, the voltage application engine (106) may apply different portions of the selecting voltages and non-selecting voltages to the target first lines (114) and target second lines (116).

The memory controller (102) may also include an isolation engine (108) which may include instructions and/or circuitry to isolate the target output that is associated with the target memory element (112) from a sneak output. The isolation engine (108) may rely on a time delay between arrival of the target output and the sneak output in isolating the target output. For example, the sensing circuitry (104) may receive a received output from the crossbar array (110) which includes both the target output received at one point in time and the sneak output that is received at another, and later, point in time. In this example, the isolation engine (108) may include a filter that filters the received output such that just the target output is output from the filter. In another example, the isolation engine (108) may select a sensing period based on the time delay. The sensing period may be a period of time when the target output is received, but based on the time delay, the sneak current is not yet received. Accordingly, the sensing circuitry (104) may be enabled during the sensing period, to detect the target output, and may be disabled outside the sensing period, to avoid detection of the sneak output.

The memory controller (102) may include other elements that relate to the determining of a resistance state of the target memristor (112). For example, the memory controller (102) may include first line (114) and second line (116) selectors that selectively couple the first lines (114) and second lines (116) to voltage sources to apply the various voltages discussed to the first lines (114) and second lines (116).

Figure 2:
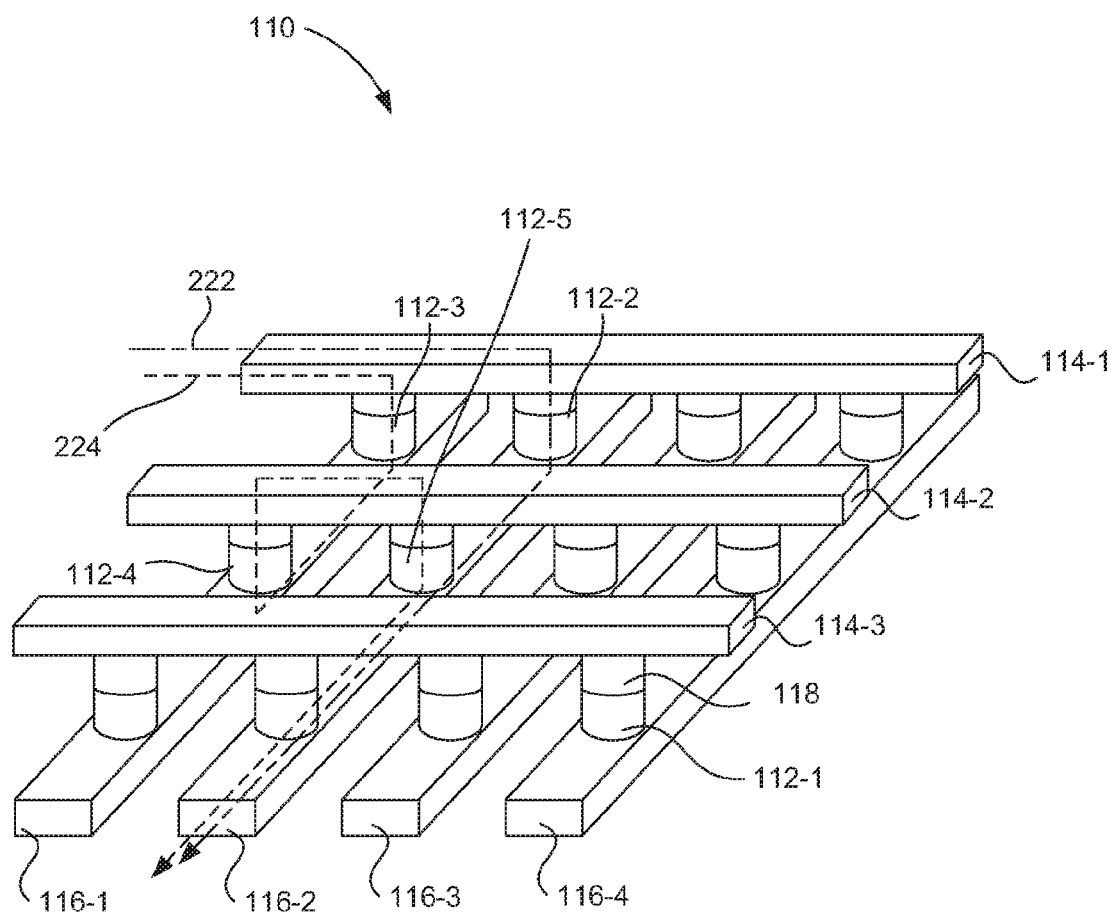
FIG. 2 is a diagram of a crossbar array used within the computing device of FIG. 1, according to one example of the principles described herein.

FIG. 2 is a diagram of a crossbar array (110) used within the system (FIG. 1, 100), according to one example of the principles described herein. The crossbar array (110) includes a number of first lines (114-1, 114-2, 114-3) that are indicated in FIG. 2 as rows. The first lines (114) may be approximately parallel to one another. The crossbar array (110) also includes a number of second lines (116-1, 116-2, 116-3, 116-4) that are indicated in FIG. 2 as columns. The second lines (116) may also be approximately parallel to one another. Even though three first lines (114) and four second lines (116) are depicted in FIG. 2, any number of first lines (114) and second lines (116) may be present in the crossbar array (110. While FIG. 2 depicts the lines (114, 116) as having rectangular cross sections, the lines (114, 116) can have other cross sectional geometries including square, circular, elliptical or more complex cross sections.

As described above, memory elements (112) within a crossbar array (110) may indicate a logic value which may be determined based on a resistance state of the memristor. To read the resistance state of a particular memory element (112), a selecting voltage may be applied to a memory element (112). For example, to read the resistance of a target memory element (112-2) a first portion of the selecting voltage, i.e., a positive voltage may be applied to a target first line (114-1). Similarly, a second portion, for example a negative polarity voltage, may be applied to a target second line (116-2). The resulting voltage drop across the memory element (112-2) creates a current flow that is indicated by the short/long dashed line (222). Sensing circuitry, such as that described below, measures the target output current along the target second line (116-2). From the target output current, the system (FIG. 1, 100) determines the resistance, and logic value, indicated by the target memory element (112-2).

However, as described above, the applied voltages also cause electron flow across other memory elements (112), i.e., partially-selected memory elements (112-3, 112-4, 112-5). The voltage drop across the partially-selected memory elements (112-3, 112-4, 112-5) generates sneak currents, such as the sneak current indicated by the dashed line (224). Sneak currents can obscure the reading of the target memory element (112-2) resistance state. The impact of the sneak current increases as the size of the crossbar array (110) increases such that large enough sneak currents may make an accurate reading of a target memory element (112-2) impossible.

Accordingly, the present specification describes systems and method for sensing an output signal for a crossbar array (110) that reduces the likelihood of sneak current detection. In this example, a selector (118) may be disposed in series with the memristor (112). For simplicity one selector (118) is indicated with a reference number, however each memory element (112) may have a corresponding selector (118) placed serially in line with the memory element (112). Moreover, while FIG. 2 depicts a selector (118) on top of a memory element (112), any orientation of selector (118) and memory element (112) is possible, such as a memory element (112) on top of a selector (118).

The selector (118) may be an element that allows electrons to flow through a memory element (112) or that reduces electron flow through the memory element (112). For example, a selector (118) may be a diode that either allows a selecting voltage to pass to a memristor or that prevents a selecting voltage from passing to the memristor. The selector (118) may have a threshold voltage. When a supplied voltage is less than the threshold voltage of the selector (118), no voltage is seen by the memory element (112). As such, no current flows through the memory element (112). Similarly, in this example, when the supplied voltage is greater than the threshold voltage of the selector (118), the supplied voltage is seen by the memory element (112) and a current is passed through the memory element (112) and an output current received by the sensing circuitry along the second lines (116).

In some examples, the selector (118) may have a time delay for allowing a voltage to pass through. For example, depending on the characteristics of the selector (118) there may be a time delay between when a selecting voltage is received at the selector (118), and when the selector (118) opens allowing the corresponding memristor (112) to see the selecting voltage. In one example, the selector (118) may be a voltage dependent time delay selector (118). In other words, the selector (118) may have a shorter response time for a larger received voltage. The shorter response time of the selector (118) results in an output associated with the larger received voltage also being received more quickly as compared to a smaller voltage. More specifically, the selectors (118) may have a shorter time delay when a larger selecting voltage is applied as compared to the time delay when a smaller non-selecting voltage is applied. In this example, a selector (118) of a target memory element (112-2) which receives a selecting voltage, would have a shorter time delay as compared to selectors of non-target, partially-selected memory elements (112-3, 112-4, 112-5) which receive a smaller non-selecting voltage.

In some examples, the voltage dependent time delay selector (118) may be formed to have a desired voltage dependency. For example, in a metal/oxide/metal structured selector (118), the metal electrodes may be formed of silver, copper or combinations thereof. In this example, any metal may be used in forming the oxide and the metal oxide may include silver or copper ions. Examples of oxides that may form the oxide between the metal electrodes include silver oxide, copper oxide, doped silicon oxide, silver, and copper. In this example, when the mobile metal ions are included in the oxide, they may form a volatile conducting path of which a formation time of the selector is dependent on the applied voltage.

Accordingly, as will be described below in connection with FIG. 3, the memory controller (FIG. 1, 102) may isolate the faster target output from the slower non-target, or sneak output. For example, a time delay filter may be applied which allows the faster target output to be detected while preventing the slower non-target output from being detected. In another example, the memory controller (FIG. 1, 102) may select a sensing period such that a faster target output would be sensed, but a slower non-target, or sneak output, would not be sensed. Accordingly, the selector (118) may have a voltage dependency such that larger voltages are processed faster than smaller voltages. Doing so may allow a target output associated with a larger selecting voltage to be received more quickly than a sneak current that is associated with a smaller non-selecting voltage. The difference between the arrival of a target current and a sneak current may be used to more effectively set the sensing period.

Additionally, as can be seen in FIG. 2, the target output path (222) passes through one selector (118), i.e., the selector (118) associated with the target memory element (112-2), while the non-target, or sneak, output path (224) passes through three selectors (118). As the number of selectors (118) that are accessed are greater for the non-target or sneak output, a sensing period, or filter, that is based on the time for a current to flow through a single selector (118) may be used to remove the effect of the sneak current on the output current. In other words, the sensing period or filter may be selected based on a time for the selecting voltage to pass through one selector (118). As a sneak current passes through more than one selector (118), a sneak current would arrive at the sensing circuitry after the sensing period has closed and therefore is not detected. Again reducing the effect of a sneak current on the detected current of a crossbar array (110).

Figure 3:
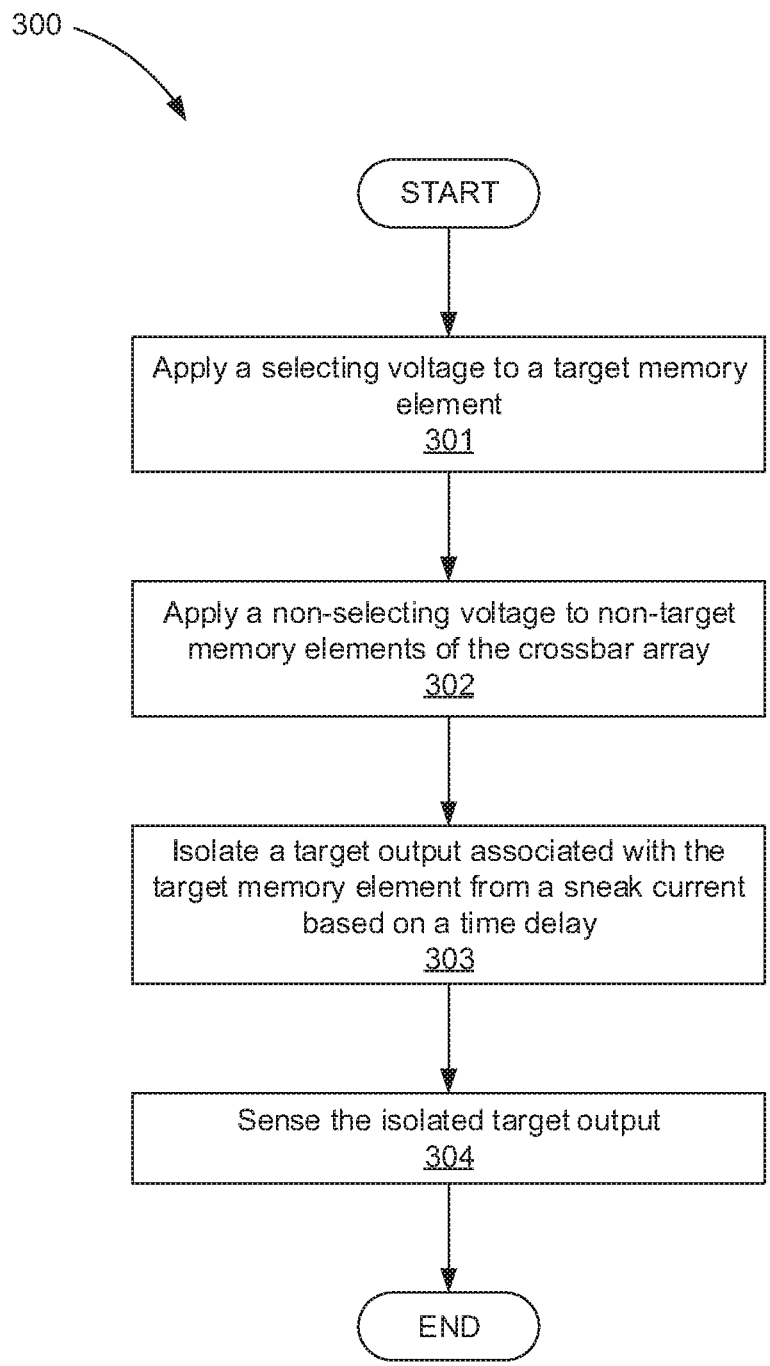
FIG. 3 is a flowchart of a method for sensing an output signal in a crossbar array, according to one example of the principles described herein.

FIG. 3 is a flowchart of a method (300) for sensing an output signal in a crossbar array (FIG. 1, 110), according to one example of the principles described herein. The method (300) includes applying (block 301) a selecting voltage to a target memory element (FIG. 2, 112-2). As described above, a selecting voltage is a voltage applied to a target memory element (FIG. 2, 112-2) that is used to read a resistance value of a target memory element (FIG. 2, 112-2) or to write a resistance value to the target memory element (FIG. 2, 112-2). The selecting voltage may be applied via a target first line (FIG. 2, 114-1) and a target second line (FIG. 2, 116-2) in which the target first line (FIG. 2, 114-1) and the target second line (FIG. 2, 116-2) refer to one of the first lines (FIG. 2, 114) and one of the second lines (FIG. 2, 116) that supply a voltage to the target memory element (FIG. 2, 112-2).

The selecting voltage may be greater than a threshold voltage of the selector (FIG. 1, 118). For example, a selector (FIG. 1, 118) may have a threshold voltage that when exceeded allows electron flow across the corresponding memory element (FIG. 1, 112). Accordingly, a selecting voltage that is greater than the threshold voltage of the corresponding selector (FIG. 1, 118) may allow current flow across the target memory element (FIG. 2, 112-2). In some examples, the selecting voltage may be less than the switching voltage of a memory element (FIG. 1, 112-2), the switching voltage being a voltage used to switch the resistance state of the memory element (FIG. 1, 112-2). For example, a read voltage may be less than the switching voltage such that the resistance state of the target memory element (FIG. 2, 112-2) is read but not changed. In another example, the selecting voltage may be greater than the switching voltage of the memory element (FIG. 2, 112-2) so as to change the resistance state of the memory element (FIG. 2, 112-2) as in a write operation.

As described above, the selector (FIG. 1, 118) may be a voltage dependent time delay selector (FIG. 1,118). In other words the selector (FIG. 1, 118) may "open" and allow current to pass through faster as the voltage seen by the selector (FIG. 1, 118) is larger. Accordingly, the selecting voltage, i.e., a read voltage or write voltage, may be sufficiently large so as to decrease the time by when the selector (FIG. 1, 118) opens.

The method (300) includes applying (block 302) a non-selecting voltage to non-target memory elements (FIG. 1, 112) of the crossbar array (FIG. 1, 110). In some examples, the non-selecting voltage may be smaller than the selecting voltage, for example half the value of the selecting voltage. Applying (block 302) a non-selecting voltage to non-target memory elements (FIG. 1, 112) may reduce the sneak current. The non-target memory elements (FIG. 1, 112) may still see a voltage drop; however, due to the voltage dependency of the selector (FIG. 1, 118) and the relative values of the selecting voltage and the non-selecting voltage, a time delay is generated between when sensing circuitry (FIG. 1, 104) will receive the target output, associated with the selecting voltage, and a sneak output, associated with the non-selecting voltage.

The method also includes isolating (block 303) a target output associated with the target memory element (FIG. 2, 112-2) from a sneak current based on a time delay. For example, the sensing circuitry (FIG. 1, 104) or the isolation engine (FIG. 1, 108) may include circuitry that filters a received signal based on the time delay such that a target output of the received signal is output and a sneak output that is filtered out and not output.

In one example, isolating (block 303) the target output may include selecting a sensing period to isolate a target output that corresponds to the target memory element (FIG. 2, 112-2). As described above, as a selecting voltage is applied and resultant voltage drop across the target memory element (FIG. 2, 112-2) is seen, an output current, or target output, is received by sensing circuitry (FIG. 1, 104). In a similar fashion a sneak current generated by a partial voltage drop, i.e., a voltage drop not as great as the voltage drop resultant from the selecting voltage, cause sneak current paths (FIG. 2, 224) to run along the target first line (FIG. 2, 114-1) and the target second line (FIG. 2, 116-2) as indicated in FIG. 2. Accordingly, the method (300) may include selecting a sensing period to isolate the target current output from the other sneak currents. The sensing period may be selected based on the time dependency of the selector (FIG. 1, 118). For example, as the selector may have different response times for different voltages, the sensing period may be selected such that an output associated with the higher selecting voltage is detected but an output associated with a lower non-selecting voltage is not detected. For example, a response time of the selector based on a selecting voltage may be longer than 5 nanoseconds and a response time of the selector based on a non-selecting voltage may be shorter than one millisecond. A specific numerical and non-limiting example is given as follows. In this example, the selecting voltage may be 1.5 volts (V) and the selector (FIG. 1, 118) may be such that a target current output associated with the selecting voltage is received by the sensing circuitry approximately 2.5 nanoseconds after the selecting voltage is applied to the target lines (FIG. 2, 114-1, 116-2). In this example, the sensing period may be selected to be approximately 3 nanoseconds long such that the target output is sensed, but a slower sneak current associated with a lower value non-selecting voltage is not detected by the sensing circuitry. In this numerical example, the filter may as well be such that a signal received after 3 nanoseconds is filtered out.

In another example, the sensing period, or filter, may be selected based on the number of selectors (FIG. 1, 118) that a current passes through. For example, a target current may pass through just a selector (FIG. 1, 118) associated with the target memory element (FIG. 2, 112-2) while a sneak current as indicated by the line (FIG. 2, 224) may pass through selectors (FIG. 1, 118) associated with more memory elements (FIG. 2, 112-3, 112-4, 112-5). Accordingly, the sensing period, or filter, may be selected based on the time for a selecting voltage to pass through one selector (FIG. 1, 118). Selecting a sensing period based on the voltage-dependency of the selector and the number of selectors (FIG. 1, 118) a signal passes through increases the likelihood that a target output will be determined without interference from a sneak current.

Isolating (block 303) a target output by selecting a sensing period may include determining a target output during the sensing period. In other words, during the sensing period, the sensing circuitry (FIG. 1, 104) may be enabled to detect a received current. Determining a target output may include receiving a current that is indicative of a current passing through the target memory element (FIG. 2, 112-2). However, outside the sensing period, the sensing circuitry (FIG. 1, 104) may be shut down. Outside the sensing period is when any sneak current is likely to arrive at the sensing circuitry (FIG. 1, 104) due to the increased number of selectors (FIG. 1, 118) in the sneak current path and the lower value of a non-selecting voltage that results in the sneak current. Selecting a sensing period that isolates the target output and disabling the sensing circuitry (FIG. 1, 104) outside of this sensing period allows for the target output to be distanced from the sneak current such that a target output is measured with a reduced impact from the sneak current. Such unimpeded detection of a target current may allow a more accurate and efficient reading of resistance values of memory elements (FIG. 1, 112) within the crossbar array (FIG. 1, 110) and may increase the effectiveness of storing data in a crossbar array (FIG. 1, 110).

Once the target output has been isolated, the method (300) includes sensing (block 304) the isolated target output. For example, the sensing circuitry (FIG. 1, 104) may acquire the target output, which has been separated from the sneak output via filtering or alteration of a sensing period, and may pass the target output onto a device for various uses.

Figure 4:
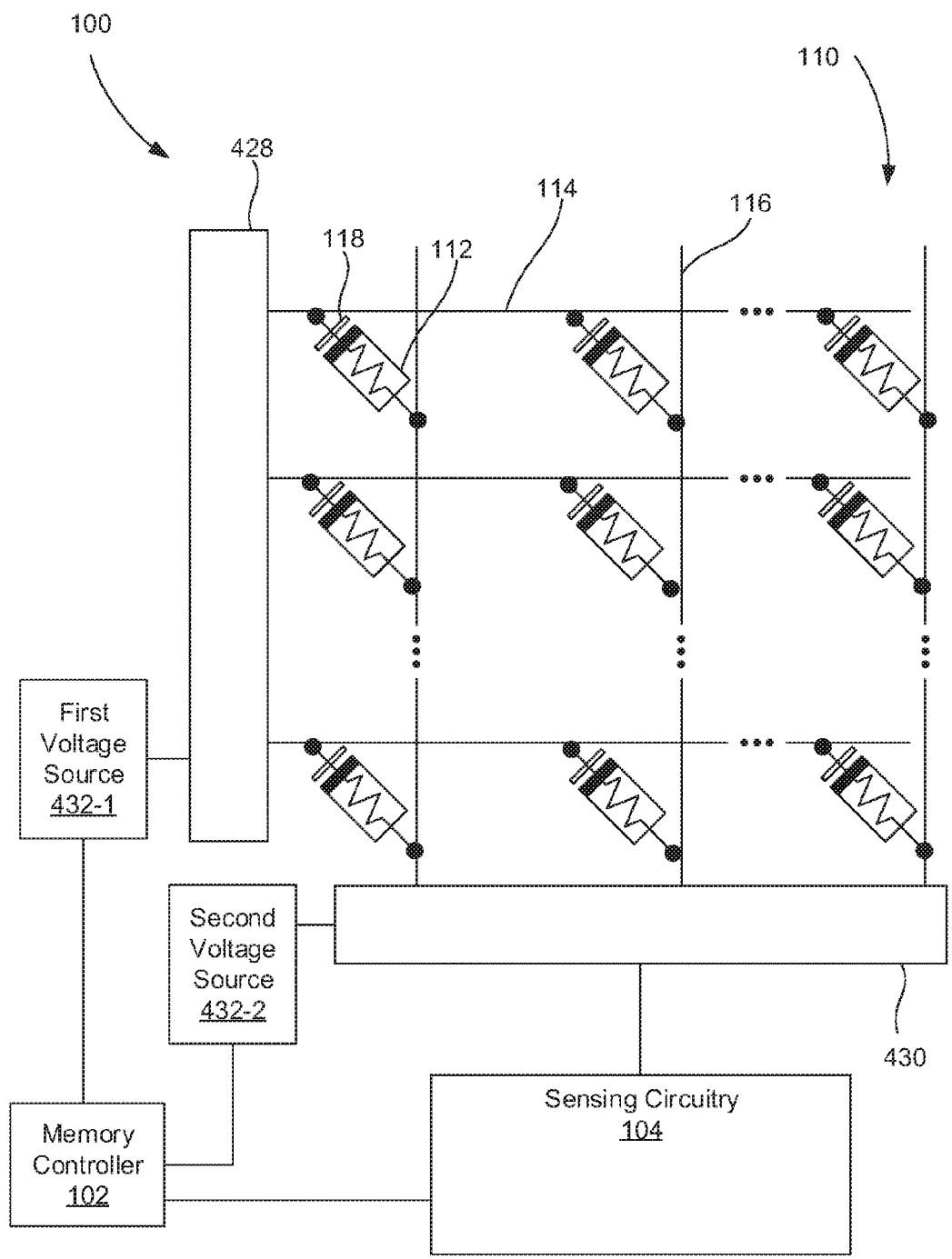
FIG. 4 is a circuit diagram of a device for sensing an output signal in a crossbar array, according to one example of the principles described herein.

FIG. 4 is a circuit diagram of a system (100) for sensing an output signal in a crossbar array (110), according to one example of the principles described herein. The crossbar array (110) may include a number of first lines (114), a number of second lines (116), a number of memory elements (112) such as memristors, and a number of selectors (118) such as non-linear selectors that are connected serially with the memristors (112). For simplicity one instance of each element is listed with a reference number.

The system (100) may also include a first line selector (428). The first line selector (428) may selectively couple different first lines (114) to a first voltage source (432-1) that passes a number of voltages to the first lines (114). The first line selector (428) may include decoders and driver circuits to carry out the selective coupling of the first voltage source (432-1) to the different first lines (114). Examples of voltages that the first voltage source (432-1) may supply include a portion of a selecting voltage applied to a target first line (FIG. 114-1) associated with a target memory element (FIG. 2, 112-2). The portion of the selecting voltage applied to the target first line (FIG. 2, 114-1) associated with the target memory element (FIG. 2, 112-2) may be the entire selecting voltage. The first voltage source (432-1) may also pass a portion of a non-selecting voltage to the first lines (FIG. 2, 1214-2, 114-3) that do not correspond to the target memory element (FIG. 2, 112-2). The first voltage source (432-1) may be coupled to the memory controller (102) which indicates to the first voltage source (432-1) which voltage value to supply to which first lines (114).

The system (100) may also include a second line selector (430). The second line selector (430) may selectively couple different second lines (116) to a second voltage source (432-2) that passes a number of voltages to the second lines (116). The second line selector (430) may include decoders and driver circuits to carry out the selective coupling of the second voltage source (432-2) to the different second lines (116). Examples of voltages that the second voltage source (432-2) may supply include a portion of a selecting voltage applied to a target second line (FIG. 2, 116-2) associated with a target memory element (FIG. 2, 112-2). In some examples, the target second line (FIG. 2, 116-2) associated with the target memory element (FIG. 2, 112-2) may be ground, for example when the entire portion of the selecting voltage is applied by the target first line (FIG. 2, 114-1) associated with the target memory element (FIG. 2, 112-2). The second voltage source (432-2) may also pass a portion of a non-selecting voltage to the second lines (FIG. 2, 116-1, 116-3, 116-4) that do not correspond to the target memory element (FIG. 2, 112-2). The second voltage source (432-2) may be coupled to the memory controller (102) which indicates to the second voltage source (432-2) which voltage value to supply to which second lines (116).

The system (100) also includes sensing circuitry (104) to sense output currents from the crossbar array (110). Specifically, output currents are collected along second lines (116) of the crossbar array (110). Accordingly, the sensing circuitry (104) may be coupled to the second lines (116) to receive output currents. The sensing circuitry (104) may include a switch to selectively couple the rest of the sensing circuitry (104) to the crossbar array (110). For example, when in the sensing period, the switch may be closed such that the sensing circuitry (104) collects and outputs detected currents such as the target output. By comparison, when outside of the sensing period, the switch may be open such that the sensing circuitry (104) does not collect and output currents, such as the sneak currents.

The sensing circuitry (104) and more specifically the switch, may be controlled by the memory controller (102) which receives executable instructions that indicate when the switch should be open and closed. The switch allows sensing circuitry (104) to be disabled such that the receipt of sneak currents is not passed and does not obfuscate the detection of target outputs.

Figure 5:
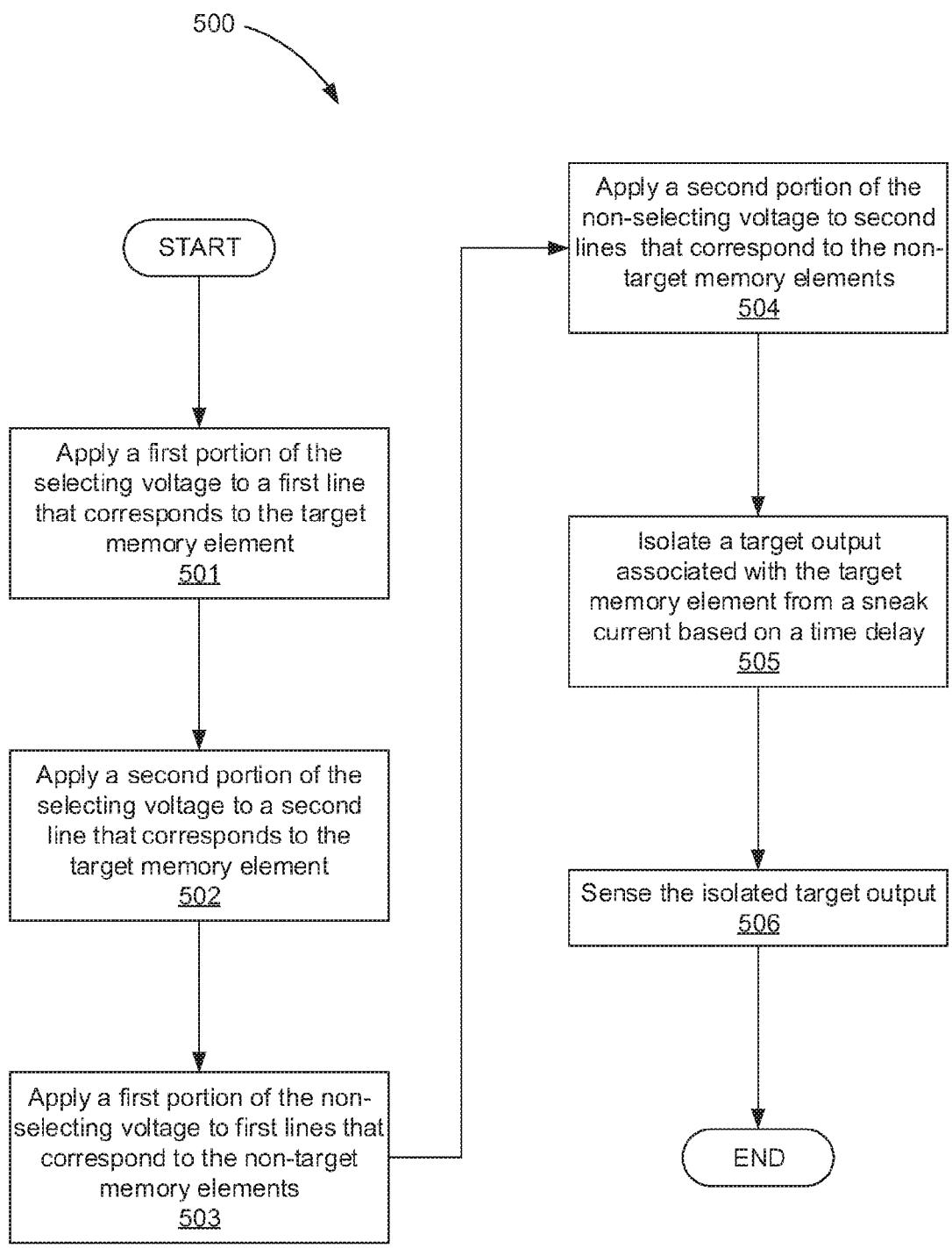
FIG. 5 is a flowchart of a method for sensing an output signal in a crossbar array, according to another example of the principles described herein.

FIG. 5 is a flowchart of a method (500) for sensing an output signal in a crossbar array (FIG. 1, 110), according to another example of the principles described herein. The method (500) includes applying (block 501) a first portion of the selecting voltage to a target first line (FIG. 2, 114-1). As described above, the resistance of a target memory element (FIG. 2, 112-2) may be calculated when an identified voltage is applied to the target memory element (FIG. 2, 112-2) and a target current obtained. Accordingly, a first portion of an identified selecting voltage may be applied (block 501) to a target first line (FIG. 2, 114-1). Similarly, a second portion of the selecting voltage may be applied (block 502) to a target second line (FIG. 2, 116-2). In some examples, the portion supplied by the target second line (FIG. 2, 116-2) may be zero volts. For example, given a selecting voltage of V, a portion V, may be applied along the target first line (FIG. 2, 114-1) corresponding to the target memory element (FIG. 2, 112-2). In this example the target second line (FIG. 2, 116-2) may be grounded.

In a similar fashion, a first portion of a non-selecting voltage may be applied (block 503) to first lines (FIG. 2, 114-2, 114-3) that correspond to non-target memory elements (FIG. 1, 112) and a second portion of the non-selecting voltage may be applied (block 504) to second lines (FIG. 116-1, 116-3, 116-4) that correspond to non-target memory elements (FIG. 1, 112). As described above applying a non-selecting voltage to other memory elements (FIG. 1, 112) in the crossbar array (FIG. 1, 102) may increase the number of selectors (FIG. 1, 112) that a sneak current passes through thus increasing the delay between when a target output current reaches the sensing circuitry (FIG. 1, 104) and when a sneak current reaches the sensing circuitry (FIG. 1, 104).

In some examples the selecting voltage may be a value V and the non-selecting voltage may be a value that is less than or equal to V/2. As described above, a voltage dependent time delay selector (FIG. 1, 118) may process a larger voltage more quickly than a smaller voltage. Accordingly, passing a smaller voltage to non-target memory elements (FIG. 1, 112) may result in a sneak current that takes longer to reach the sensing circuitry (FIG. 1, 104) as compared to the target current.

The method (500) may include isolating (block 505) a target output associated with the target memory element (FIG. 2, 112-2) based on a time delay. This may include implementing a filter that filters out signals received after the target output. In other examples, isolating (block 505) a target output may include selecting a sensing period to isolate a target output that corresponds to the target memory element (FIG. 2, 112-2). This may include determining a target output during the sensing period and shutting down the sensing circuitry (FIG. 1, 104) outside the sensing period. The method (500) includes sensing (block 506) the isolated target output. This may be performed as described above in connection with FIG. 3.

Figure 6:
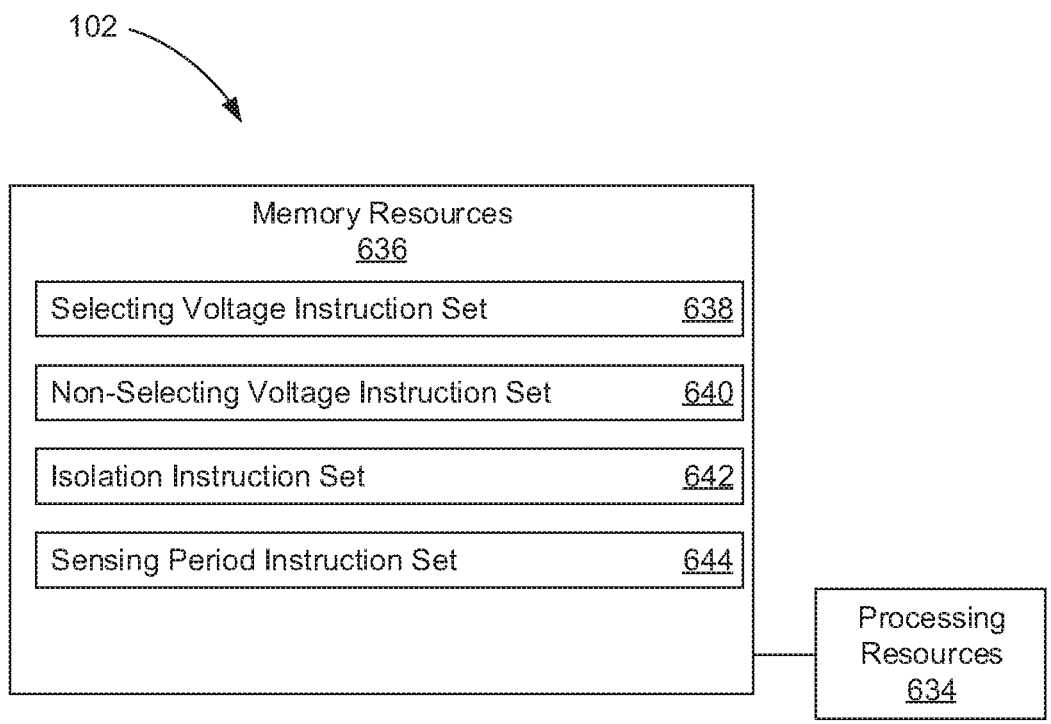
FIG. 6 is a diagram of the memory controller, according to one example of the principles described herein.

FIG. 6 is a diagram of the memory controller (102), according to one example of the principles described herein. In this example, the memory controller (102) includes processing resources (634) that are in communication with the memory resources (636). The processing resources (634) may include circuitry and other resources, such as processors, used to process programmed instructions. The memory resources (636) represent generally any memory capable of storing data such as programmed instructions or data structures used by the device (100). The programmed instructions shown stored in the memory resources (636) include a selecting voltage instruction set (638), a non-selecting voltage instruction set (640), an isolation instruction set (642), and a sensing period instruction set (644).

The memory resources (636) include a machine readable storage medium that contains machine readable instructions to cause tasks to be executed by the processing resources (634). The machine readable storage medium may be tangible and/or non-transitory storage medium. The machine readable storage medium may be any appropriate storage medium that is not a transmission storage medium. A non-exhaustive list of machine readable storage medium types includes non-volatile memory, volatile memory, random access memory, memristor based memory, write only memory, flash memory, electrically erasable program read only memory, magnetic storage media, other types of memory, or combinations thereof. Many other types of memory may also be utilized, and the present specification contemplates the use of many varying type(s) of memory in the memory resources (636) as may suit a particular application of the principles described herein. In certain examples, different types of memory in the memory resources (636) may be used for different data storage needs.

The selecting voltage instruction set (638) represents programmed instructions that, when executed, cause the processing resources (634) to apply a first portion and a second portion of a selecting voltage to a target first line (FIG. 2, 114-1) and a target second line (FIG. 2, 116-2) respectively. The non-selecting voltage instruction set (640) represents programmed instructions that, when executed, cause the processing resources (634) to apply a first portion and a second portion of a non-selecting voltage to non-target first lines (FIG. 2, 114-2, 114-3) and non-target second lines (FIG. 2, 116-1, 116-3, 116-4) respectively. The isolation instruction set (642) represents programmed instructions that, when executed, cause the processing resources (634) to isolate a target output current from a non-target output current based on a time delay between an arrival of a target output current from a non-target output current. The sensing period instruction set (644) represents programmed instructions that, when executed, cause the processing resources (634) to select a sensing period to isolate the target output current.

Further, the memory resources (636) may be part of an installation package. In response to installing the installation package, the programmed instructions of the memory resources (636) may be downloaded from the installation package's source, such as a portable medium, a server, a remote network location, another location, or combinations thereof. Portable memory media that are compatible with the principles described herein include DVDs, CDs, flash memory, portable disks, magnetic disks, optical disks, other forms of portable memory, or combinations thereof. In other examples, the program instructions are already installed. Here, the memory resources can include integrated memory such as a hard drive, a solid state hard drive, or the like.

In some examples, the processing resources (634) and the memory resources (636) are located within the same physical component, such as a server, or a network component. The memory resources (636) may be part of the physical component's main memory, caches, registers, non-volatile memory, or elsewhere in the physical component's memory hierarchy. Alternatively, the memory resources (636) may be in communication with the processing resources (634) over a network. Further, the data structures, such as the libraries and may be accessed from a remote location over a network connection while the programmed instructions are located locally. Thus, the memory controller (102) may be implemented on a user device, on a server, on a collection of servers, or combinations thereof.

The memory controller (102) of FIG. 6 may be part of a general purpose computer. However, in alternative examples, the memory controller (102) is part of an application specific integrated circuit.

Aspects of the present system and method are described herein with reference to flowchart illustrations and/or block diagrams of methods, apparatus (systems) and instruction sets according to examples of the principles described herein. Each block of the flowchart illustrations and block diagrams, and combinations of blocks in the flowchart illustrations and block diagrams, may be implemented by machine readable instructions. The machine readable instructions may be provided to a processing resources (634) of a general purpose computer, special purpose computer, or other programmable data processing apparatus to produce a machine, such that the machine readable instructions, when executed via, for example, the processing resources (634) or other programmable data processing apparatus, implement the functions or acts specified in the flowchart and/or block diagram block or blocks. In one example, the machine readable instructions may be embodied within a machine readable storage medium; the machine readable storage medium being part of the computer program product. In one example, the machine readable storage medium is a non-transitory machine readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A method, the method comprising:
   applying a selecting voltage to a target memory element of the crossbar array;
   applying a non-selecting voltage to non-target memory elements of the crossbar array;
   isolating, with sensing circuitry, a target output that is associated with the target memory element from a sneak output based on a time delay between arrival of the target output and the sneak output; and
   sensing the isolated target output.

2. The method of claim 1, in which applying a selecting voltage to a target memory element of the crossbar array comprises:
   applying a first portion of the selecting voltage to a target first line that corresponds to the target memory element; and
   applying a second portion of the selecting voltage to a target second line that corresponds to the target memory element.

3. The method of claim 1, in which isolating, with sensing circuitry, a target output associated with the target memory element from a sneak output comprises filtering a received output based on the time delay, in which the received output includes the target output and the sneak output.

4. The method of claim 1, in which isolating, with sensing circuitry, a target output associated with the target memory element from a sneak output comprises:
   selecting a sensing period to isolate the target output;
   enabling the sensing circuitry during the sensing period; and
   disabling the sensing circuitry outside of the sensing period.

5. The method of claim 4, in which the sensing period is selected to avoid sensing outputs associated with non-target memory elements.

6. The method of claim 4, in which the sensing period is selected based on a value of the selecting voltage.

7. The method of claim 4, in which the sensing period is selected based on a number of selectors that the sneak output goes through.

8. The method of claim 1, in which applying a non-selecting voltage to non-target memory elements comprises:
applying a first portion of the non-selecting voltage to a number of non-target first lines that correspond to the non-target memory elements; and
applying a second portion of the non-selecting voltage to a number of non-target second lines that correspond to the non-target memory elements.

9. The method of claim 1, further comprising generating the time delay by inserting a voltage dependent time delay selector in series with each memory element of the crossbar array.

10. The method of claim 9, wherein each selector has a time delay that decreases as a larger voltage is applied.

11. The method of claim 1, in which applying a selecting voltage to a target memory element of the crossbar array comprises:
applying the selecting voltage to a target first line that corresponds to the target memory element; and
connecting a target second line that corresponds to the target memory element to ground.

12. The method of claim 1, wherein the delay is at least 3 nanoseconds long.

13. A system, the system comprising:
a crossbar array of memory elements, the crossbar array comprising,
a number of first lines;
a number of second lines intersecting the first lines, a memory element located at each intersection of a first line and a second line;
a number of selectors, each selector corresponding to a memory element to select a corresponding memory element based on a selecting voltage; and
a memory controller, in which the memory controller comprises:
sensing circuitry to sense a target output associated with a target memory element;
a voltage application engine to apply a number of voltages to the memory elements; and
an isolation engine to isolate the target output that is associated with the target memory element from a sneak output based on a time delay between arrival of the target output and the sneak output.

14. The system of claim 13, in which the memory elements are memristor devices.

15. The system of claim 13, in which a sensing period is selected based on a time for the selecting voltage to pass through one selector.

16. The system of claim 13, in which the selector has a time delay for opening.

17. The system of claim 16, in which the selector has a voltage dependent time delay for opening.

18. A non-transitory machine-readable storage medium encoded with instructions executable by a controller, the machine-readable storage medium comprising:
instructions to apply a first portion and a second portion of a selecting voltage to a target first line and a target second line, respectively, in which the target first line and target second line correspond to a target memory element;
instructions to apply a first portion and a second portion of a non-selecting voltage to a number of non-target first lines and a number of non-target second lines, respectively that correspond to non-target memory elements; and
instructions to isolate a target output current from a non-target output current based on a time delay between an arrival of a target output current from a non-target output current.

19. The non-transitory machine-readable storage medium of claim 18, comprising instructions to select a sensing period to isolate a target output current from a non-target output current based on a time delay between a target output and a sneak current.

20. The non-transitory machine-readable storage medium of claim 18, in which the selecting voltage is at least two times as large as the non-selecting voltage.

* * * * *